United States Patent [19]

Shah

[11] Patent Number: 4,924,564

[45] Date of Patent: May 15, 1990

[54] ULTRASONIC REMOTE CONTROLLED SWITCHING DEVICE

[76] Inventor: Reza H. Shah, 1176 Rutherford Road, Maple, Ontario, Canada, L6A 1S2

[21] Appl. No.: 384,783

[22] Filed: Jul. 25, 1989

[51] Int. Cl.$^5$ .......................... F24B 1/18; G10K 11/00
[52] U.S. Cl. .................................... 126/512; 126/503; 307/308; 367/197
[58] Field of Search ................. 126/503, 512; 307/308; 367/197, 199; 358/194.1

[56] References Cited

U.S. PATENT DOCUMENTS 4,793,322  12/1988  Shimek et al. ...................... 126/503

*Primary Examiner*—Carroll B. Dority
*Attorney, Agent, or Firm*—David W. Wong

[57] ABSTRACT

An ultrasonic remote controlled switching device having very low power consumption is shown. The device is capable of switching high power and/or generating a power pulse for operating associated electrical control devices. The switching device responses to ultrasonic wave generated by a remote hand-held transmitter unit to change its state from ON to OFF or vice versa and simultaneously generates the desirable power pulse. The remote switching device is suitable for use in remotely controlling the operation of a natural gas fireplace.

12 Claims, 2 Drawing Sheets

4,924,564

ULTRASONIC REMOTE CONTROLLED SWITCHING DEVICE

BACKGROUND OF THE INVENTION

This invention relates to a switching device, and more particularly to an ultrasonic remote controlled switching device having very low power consumption.

Remote controlled switching devices are commonly used for switching electrical appliances such as televisions and the like ON or OFF. The remote controlled switching device may either be incorporated as an integral part of the electrical appliance or is separate from the latter and to which the appliance is connected. The switching devices and the appliances are commonly operated with the household current and they operate with a current draw in excess of 10 milliamperes which, in terms of electronic equipment consume a relatively large amount of electrical power, particularly when it is necessary for such device to be constantly energized so that it is always ready to be actuated to switch on the equipment of which it controls. Such switching devices are not practical for controlling equipment which are located remote from a household current power source or receptacle. Furthermore, the electrical circuit in such switching devices is usually very complex in construction so that it is costly to manufacture; and the large number of components employed in the circuitry are prone to failure in operation. Attempt to install such switching devices for equipment not readily adjacent to a household current power source may require major alteration of the building structure to route special wiring to supply the operating power to the equipment.

SUMMARY OF THE INVENTION

It is the primary object of the present invention to provide a remote controlled switching device having an extremely low power consumption.

It is another object of the present invention to provide a remote controlled switching device which uses relatively few components which are low cost and is simple and inexpensive to produce.

It is yet another object of the present invention to provide a remote controlled switching device which can be operated with low voltage batteries and yet has a long operating life and can be easily and quickly installed in any desirable location without complicated alteration of the building structure.

It is still another object of the present invention to provide a remote controlled switching device which is operated with ultrasound so that it's operation does not cause any adverse interference to the normal operation of the equipment being controlled or other electrical equipment located in the neighbourhood.

Still yet another object of the present invention is to provide a remote controlled switching device which also generates a power pulse whenever it is actuated for operating associated controlling devices for the equipment being controlled.

DETAILED DESCRIPTION OF THE PREFERRED EMBODIMENTS

Figure 1:
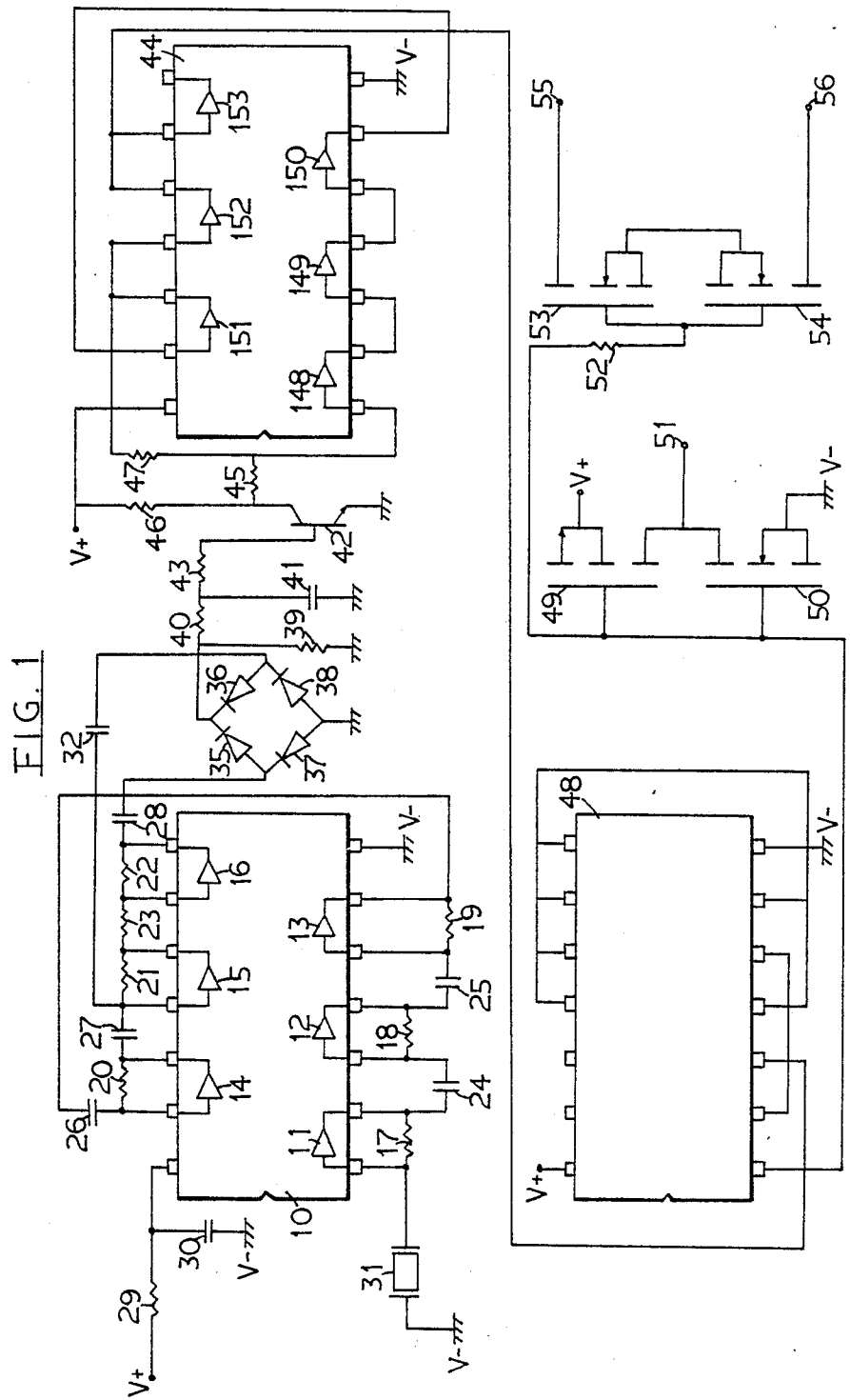
FIG. 1 is an electrical schematic diagram of the switching device according to the present invention.

With reference to the drawings, the remote controlled switching device of the present invention is constructed primarily with three low cost low power consumption metal oxide semiconductors commonly called complementary metal oxide semiconductors or abbreviated as CMOS. Such semiconductors are digital integrated devices and contains a series of inverters. In the present invention, a first digital CMOS device 10 contains six inverters 11 to 16 connected in parallel with resistors 17 to 22 and 23 and output bias and coupling capacitors 24 to 28 to act as cascaded analog amplifiers. The CMOS device 10 can be operated with very low power source such as a 9 volts battery applying a positive potential to the supply pin therein. The operating voltage is supplied through a high resistance resistor 29 in series with the positive potential V+ of the power supply, and is decoupled with a capacitor 30 connected to the negative potential V− of the power supply as shown. The high resistance resistor 29 ensures a very low power consumption by the CMOS device 10, since the supply voltage is automatically adjusted to a low level because of the self-biassing effect provided by the resistor 29. A transducer device 31 such as an ultrasonic transducer is connected to the input of the cascaded amplifiers, so that the signal generated by the transducer 31 is repeatedly amplified by these amplifiers. The low current bias of the amplifiers results in a high output impedance which provides a highly desirable low frequency attentuation. Various types of well known transducers such as an ultrasonic transducer, optical transducer, or electromagnetic wave transducer may be employed which can response to a remotely produced signal to generate a voltage signal. An ultrasonic transducer is preferred, in that, the sound signal for actuating the transducer is not directional and can reflect from obstacles while it does not cause any adverse interference to the normal operation of any electronic circuit components in other equipment located in the same neighbourhood of the switching device.

The ultrasonic transducer 31 is connected directly to the input of the cascaded amplifiers. The transducer 31 acts as a virtual earth because of the provision of the feedback resistor 17 which is connected from the output to the input of the first amplifier in the cascade. This results in a low input impedance at the amplifier input thus reducing the input noise level.

The amplified signal from the cascaded amplifiers is fed through two coupling capacitors 32 and 28 to a full wave bridge rectifier comprising diodes 35, 36, 37 and 38. Although a full wave rectifier is shown, it can be appreciated that a half wave rectifier may be used instead to provide a similar result. A grounding resistor 39 is connected at the output terminal of the bridge rectifier to the ground such that when the output signal from the rectifier is low or when the output signal is absent, any residual stray charges would bleed through resistor 39 to the ground to ensure no nuisance operation of the device. The series resistor 40 which charges the capacitor 41 is chosen at such value to provide a selected desirable long enough period of time to charge the capacitor 41 to the voltage at which the transistor 42 can be turned on via the resistor 43. As undesirable noise signals are commonly of a short duration, the undesirable noise signals if reaching capacitor 41 will not be of such a level to turn on the transistor 42. Thus, the transistor 42 can only be turned on by the signal generated by the transducer 31. The transistor 42 as shown in FIG. 1 is an NPN transistor. It can be appreciated by those skilled in the art that a PNP transistor may be used for the purpose with the polarity of the diodes of the bridge rectifier connected in the reverse as shown. The collector of the transistor 42 is connected to a second digital CMOS device 44 through coupling resistors 45, 46 and 47. The CMOS device 44 contains six inverters 148,149,150,151,152 and 153 and its terminals are arranged to operate as a Schmidt trigger which converts an input signal into a square wave pulse signal.

The square wave pulse signal from the CMOS device 44 is passed to a third digital CMOS device 48 which is a type D Flip-flop device and is arranged such that its output will change its state from low to high or vice versa whenever a fresh signal is received by its input, namely, whenever, the transducer 31 is actuated by a remote ultrasound generating unit. The output of the CMOS device 48 operating as a Flip-Flop is fed directly to an inverter consisting of a P-channel surface-channel field-effect transistor 49 commonly referred to as P-channel VMOSFET and an N-channel VMOSFET transistor 50. The drain terminal 51 of these VMOSFET transistors 49 and 50 are connected together, so that whenever a signal is generated by the transducer 31 a high power pulse signal appears at the output drain terminal 51 of the VMOSFET transistors 49 and 50. The power pulser may alternatively be constructed with common bipolar NPN or PNP transistors in a voltage follower configuration. Also, single or Darlington transistors may be used for such purpurpose. The output of the Flip-Flip device is also applied via a resistor 52 to one or two N-channel or P-channel VMOSFET transistors. Two VMOSFET transistors 53 and 54 are shown in the example shown in FIG. 1. The output terminals 55 and 45 of the VMOSFET transistors 53 and 54 will change their state from ON to OFF and vice versa whenever a fresh pulse signal is applied from the digital CMOS device 48 to the input of these transistors 53 and 54.

As described above, it can be appreciated that in operation, the switching device of the present invention is represented by the terminals 55 and 56 which will change their states from ON to OFF or vice versa whenever the transducer 31 is actuated by a remote signal and simultaneously a power pulse is present at the drain terminal 51 of the inverter consisting of VMOSFET transistor 49 and 50. Due to the negligible DC current required by the VMOSFET transistors 53 and 54, the operation of the present switching device consume almost negligible power, in the level of less than 20 microamperes, from the supply voltage power source so that a 9-volt battery can be used as a power source with relatively long operating life.

Figure 2:
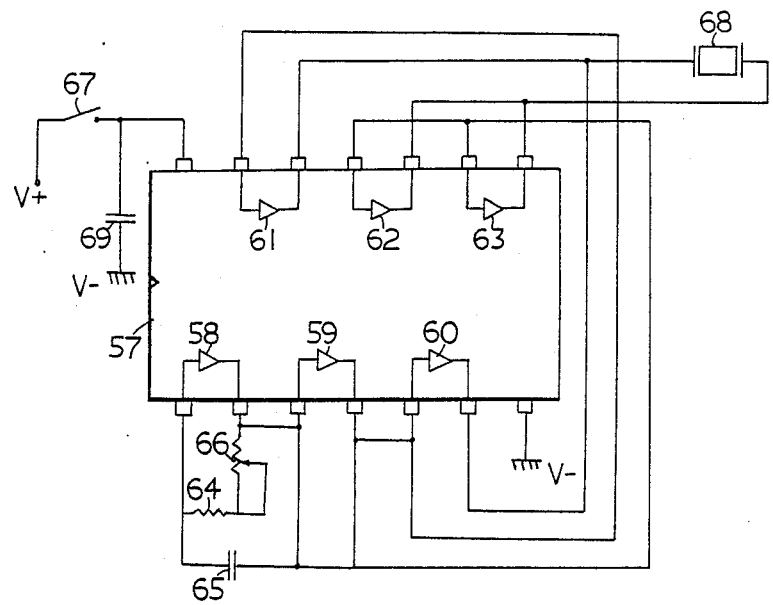
FIG. 2 is an electrical schematic diagram of the ultrasonic sound generating hand-held device usable for remotely actuating the switching device according to the present invention.

FIG. 2 shows an examplary ultrasound transmitting device which may be used as a remote controlled u nit from actuating the switching device of the present invention. Such device may also employ the low power consumption CMOS digital integrated device 57 which contains six inverters 58, 59, 60, 61, 62 and 63. The inverters 58 and 59 are connected to a resistor 64 and capacitor 65 and a potentiometer 66 to provide an oscillator. The actuating power is connected to the input terminal of the CMOS device 57 through the power switch 67 and decoupling capacitor 69. The frequency of the voltage in the oscillator may be selectively varied by adjusting potentiometer 66. The high frequency voltage signal from the oscillator is then fed through inverters 60 to 63 which acts as buffers and output driver amplifiers to drive the piezoelectric wave transducer 68 to generate and emit the ultrasonic wave signal. The simple construction of the transmitting device facilitates low cost manufacturing and it also consumes very low power such that a low voltage battery can be used as a power source with a long operating life.

Figure 3:
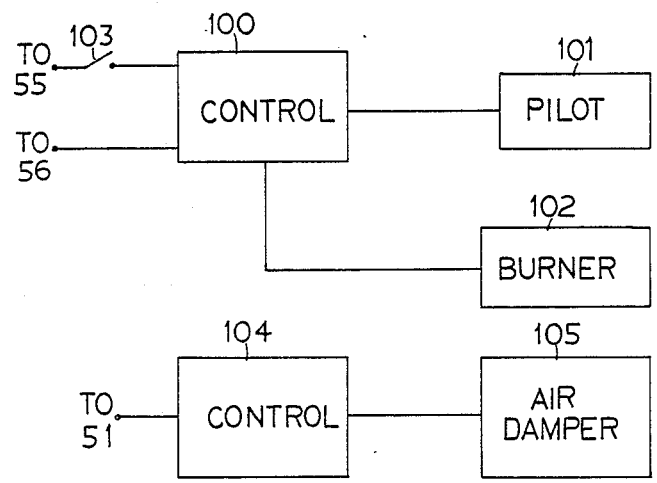
FIG. 3 is a schematic block diagram showing the use of the remote controlled switching device of the present invention for operating a gas fireplace.

Due to the relatively small number of components used in the switching device, it can be made in a very compact size and can be freely and easily incorporated into any selected equipment in place of the main ON-/OFF switch therein without complex installation. One application of the switching device is in a gas fireplace, as shown in FIG. 3, in which the switching device can be easily incorporated in the electromechanical control device 100 of the gas supply to the pilot light 101 and the burner 102 as shown in FIG. 3. The electromechanical control device 100 of the gas fireplace is normally actuated with a manual switch 103 which controls the power supply to the electromechanical control device. The manual switch can easily be replaced with the switching device of the present invention or be connected in parallel thereto such that the gas fireplace may be turned ON or OFF remotely with the remote transmitting unit. In the meantime, the power pulse signal generated from the switching device may also be utilized to incorporate with an electromechanical control 104 for controlling the fresh air damper 105 of the gas fireplace, such that whenever the switching device is actuated to turn on the gas fireplace, the power pulse from the switching device will simultaneously operate the electromechanical control 104 to cause the fresh air damper to open so as to allow more air to enter into the fireplace to enhance the ignition of the gas at the burner. The electromechanical control 104 for the fresh air damper of the fireplace may be in the form of a DC motor or solenoid adapted at the damper pivot shaft operative for turning the damper either in one direction or in the opposite direction in response to the polarity of the power pulse.

Obviously, numerous modifications and variations of the present invention are possible in light of the above teachings. It is therefore to understood that within the scope of the appended claims, the invention may be practiced otherwise than as specifically described herein.

What is claimed is:

1. A low power consumption remote controlled electronic switching device comprising,
   a transducer means operative in response to a remote wave signal to generate an electrical signal,
   a first digital integrated semiconductor means having a plurality of inverters therein, said inverters being connected in parallel with a plurality of bias resistor means and in combination therewith to form a plurality of amplifier means, said amplifier means being operative to amplify in serial said electrical signal fed from said transducer means to said digital integrated semiconductor means,
   rectifier means operative to convert an amplified signal from said amplifier means to a direct current voltage signal,
   charging means operative to be charged by said direct current voltage signal.

gating means operative in response to a selected charged voltage level of said charging means to actuate a second digital integrated semiconductor means for generating a square wave signal, a third digital integrated semiconductor means connected to said second digital integrated semiconductor means and operative to generate a drive signal, at least one semiconductor means responsive to receiving said drive signal at each instance from said third digital integrated semiconductor means to vary from an existing switch state to an opposite switch state.

2. A remote controlled electronic switching device according to claim 1 including a second semiconductor means connected to said third digital integrated semiconductor means and operative in response to receiving a drive signal from said third digital integrated semiconductor means for generating a power pulse.

3. A remote controlled electronic switching device according to claim 2 wherein said digial integrated semiconductor means are complementary metal oxide semiconductors.

4. A remote controlled electronic switching device according to claim 3 wherein said semiconductor means are surface-channel field-effect transistors.

5. A remote controlled electronic switching device according to claim 4 wherein said semiconductor means comprises a pair of surface-channel field-effect transistors each having a base terminal, a collector terminal, an emitter terminal and a drain terminal, said base terminal of said field-effect transistors being commonly connected to an output terminal of said third digital integrated semiconductor means, said emitter terminal and collector terminal of said field-effect transistors being commonly connected together, and said drain terminal of one of said pair of field-effect transistors forming one terminal of field-effect transistor forming a second terminal of said said switching device, and said drain terminal of the other switching device.

6. A remote controlled electronic switching device according to claim 5 wherein said transducer means is an ultrasonic transducer means operative responsive to remote ultrasonic wave to generate said electrical signal.

7. A remote controlled electronic switching device according to claim 6 including a remote ultrasonic wave transmitting device comprising a digital integrated semiconductor means having a power input terminal, a low voltage power means connected to said power input terminal through a manually operative switch means, said digital integrated semiconductor means having six inverter means therein, two of said six inverter means being connected with resistor means to form amplifier means operative for amplifying a power voltage from said voltage power means, an ultrasonic transducer means connected to said digital integrated semiconductor means and operative in response to an amplified signal from said amplifier means to emit an ultrasonic wave signal therefrom.

8. A remote controlled electronic switching device according to claim 7 including a frequency tuning means connected to said amplifier means and operative to vary the frequency of said ultrasonic wave signal.

9. A remote controlled electronic switching device according to claim 8 wherein said frequency tuning means includes a capacitor and an adjustable potentiometer connected in parallel to said amplifier means, said potentiometer being adjustable to select the frequency of said ultrasonic wave signal.

10. In a gas fireplace assembly having a burner for providing a flame pattern, a pilot lighter for igniting said burner, and an electromechanical control means for controlling gas supply to said burner and said pilot lighter, including a remote controlled electronic switching device operative for selectively actuating and deactuating said electromechanical control means, said electronic switching device comprising, a transducer means operative in response to an ultrasonic wave signal to generate an electrical signal, a first digital integrated semiconductor means having a plurality of inverters therein, said inverters being connected in parallel with a plurality of bias resistor means and in combination therewith to form a plurality of amplifier means, said semiconductor means having an input terminal connected to said transducer means and operative to amplifying in serial said electrical signal fed from said transducer means to said input terminal, an operating voltage power means connected to a power terminal of said semiconductor means, rectifier means connected to an output terminal of said semiconductor means and operative to convert an amplified signal from said amplifier means to a direct current voltage signal, charge storage means connected to output of said rectifier means and operative to be charged by said direct current voltage signal to a predetermined charge voltage level, gating means operative in response to a said predetermined charge voltage level of said charge storage means to actuate a second digital integrated semiconductor means for generating a square wave signal, a third digital integrated semiconductor means connected to said gating means and operative to generate a drive signal, at least one field-effect transistor means connected to said third digital integrated semiconductor means and operative to received said drive signal at each instance from said third digital integrated semiconductor means to actuate said electromechanical control means selectively.

11. In a gas fireplace assembly according to claim 10 including a remote ultrasonic wave transmitting device comprising a digital integrated semiconductor means having a power input terminal, a low voltage power means connected to said power input terminal through a manually operative switch means, said digital integrated semiconductor means having a plurality of inverters therein connected in parallel with a plurality of resistor means to form amplifier means, said amplifier means being operative for amplifying a power voltage signal from said voltage power means, an ultrasonic transducer means connected to said digital integrated semiconductor means and operative in response to an amplified signal from said amplifier means to emit an ultrasonic wave signal therefrom.

12. In a gas fireplace assembly according to claim 11 wherein said digital integrated semiconductor means are complementary metal oxide semiconductors.

* * * * *